United States Patent
Bae et al.

(10) Patent No.: US 8,390,317 B2
(45) Date of Patent: Mar. 5, 2013

(54) BIDIRECTIONAL EQUALIZER WITH CMOS INDUCTIVE BIAS CIRCUIT

(75) Inventors: Seung-jun Bae, Hwaseong-si (KR); Young-sik Kim, Gunpo-si (KR); Sang-hyup Kwak, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 417 days.

(21) Appl. No.: 12/832,212

(22) Filed: Jul. 8, 2010

(65) Prior Publication Data

US 2011/0026334 A1    Feb. 3, 2011

(30) Foreign Application Priority Data

Jul. 31, 2009 (KR) .................. 10-2009-0070677

(51) Int. Cl.
*H03K 19/0175* (2006.01)
(52) U.S. Cl. .......................... 326/30; 326/86
(58) Field of Classification Search .................. None
See application file for complete search history.

(56) References Cited

U.S. PATENT DOCUMENTS

| | | | | |
|---|---|---|---|---|
| 5,729,152 | A | * | 3/1998 | Leung et al. ............ 326/21 |
| 6,731,137 | B1 | | 5/2004 | Rangan et al. |
| 6,788,099 | B2 | | 9/2004 | Zakai |
| 7,174,400 | B2 | | 2/2007 | Horowitz et al. |
| 7,928,757 | B2 | * | 4/2011 | Nguyen et al. ............ 326/30 |
| 7,994,813 | B2 | * | 8/2011 | Sohn et al. ............ 326/30 |
| 2007/0176638 | A1 | | 8/2007 | Park |

\* cited by examiner

*Primary Examiner* — Crystal L Hammond
(74) *Attorney, Agent, or Firm* — Volentine & Whitt, PLLC

(57) ABSTRACT

An integrated circuit (IC) device, system and related method of communicating data are described. The IC device includes; a data port configured to provide output data to a channel and receive input data from the channel, an impedance matching circuit connected to the data port and configured to operate as an output driver circuit when the output data is being transmitted and as an on die termination circuit when the input data is being received, and an active inductive bias circuit connected to the data port in parallel with the impedance matching circuit, and configured to adjust the impedance of the data port to the channel during transmission of the output data as a function of output data frequency and adjust the impedance of the data port to the channel during receipt of the input data as a function of input data frequency.

29 Claims, 11 Drawing Sheets

BIDIRECTIONAL EQUALIZER WITH CMOS INDUCTIVE BIAS CIRCUIT

CROSS-REFERENCE TO RELATED APPLICATION

This U.S. non-provisional patent application claims priority under 35 U.S.C. §119 to Korean Patent Application No. 2009-0070677 filed Jul. 31, 2009, the subject matter of which is hereby incorporated by reference.

BACKGROUND

The present inventive concept is related to input/output circuitry for integrated circuit devices such as semiconductor memory devices. More particularly, the disclosure is related to a bidirectional equalizer incorporating a CMOS inductive bias circuit and applied to a data port of an integrated circuit device.

As greater data bandwidth and enhanced functionality are increasingly demanded from all types of integrated circuit devices, the corresponding transmission frequency for data received by and transmitted from such devices has increased. Such higher data transmission frequencies cause many problems as conventional input/output (I/O) circuits are ill-adapted to the higher transmission frequencies. For example, inter-symbol interference (ISI) tends to rise with data transmission frequency and many conventional ISI compensation techniques are not well adapted for inclusion within the I/O circuitry of contemporary integrated circuit devices (i.e., within chip-to-chip I/O interfaces). This is particularly true of densely integrated devices such as semiconductor memory devices.

One technique commonly applied to the problems associated with high speed data transmission to/from integrated circuits is the provision of a so-called "equalizer" within I/O interfaces (i.e., ports communicating data, address, and/or control signals). FIG. 1 illustrates a generic channel 8 connected to an I/O interface 5 including a conventional equalizer 7. The equalizer 7 is essentially an impedance matching circuit formed by a resistor-inductor-capacitor (RLC) circuit including a passive inductor (L) having the impedance (Z) to frequency (f) characteristics shown in FIG. 2. Generally speaking, as the frequency (f) of I/O signals being communicated between channel 8 and I/O interface 5 varies, the passive inductor (L) compensates for the frequency variations, matches impedance, and thereby prevent high speed signal transmission problems such as ISI.

In the illustrated embodiments, the channel 8 may take many different physical forms, including hardwire components (e.g., metal trace, micro-strip, conductive signal line, and/or metal contact) and/or wireless components (e.g., RF, microwave, optical, and/or inductive). The data, address, and/or control signals being communicated via the channel 8 may be communicated in analog and/or digital form.

While the conventional provision of an equalizer mitigates some of the difficulties caused by the transmission of high speed signals data to/from contemporary integrated circuit devices, it raises several design challenges. For example, conventional equalizers including passive inductors are relatively large in their physical size, and frustrate ongoing efforts to increase the integration density of constituent devices, particularly semiconductor memory devices.

SUMMARY

In one embodiment of the inventive concept an integrated circuit device is provided and comprises: a data port configured to provide output data to a channel and receive input data from the channel; an impedance matching circuit connected to the data port and configured to operate as an output driver circuit when the output data is being transmitted and as an on die termination circuit when the input data is being received; and an active inductive bias circuit connected to the data port in parallel with the impedance matching circuit, and configured to adjust the impedance of the data port to the channel during transmission of the output data as a function of output data frequency and adjust the impedance of the data port to the channel during receipt of the input data as a function of input data frequency.

In a related aspect, the active inductive bias circuit may comprise a delay circuit comprising a first loop node connected to the data port and a second loop node separated from the first node by a delay unit. The delay circuit may further comprise an isolating inverter disposed in parallel with the delay unit between the first and second loop nodes, and the delay unit may comprise a plurality of series connected inverters.

In another related aspect, the active inductive bias circuit may further comprise a voltage level shifting circuit disposed between the first loop node and the delay unit. The voltage level shifting circuit may comprise a plurality of voltage dividing resistors.

In yet another related aspect, the impedance matching circuit may comprise: a first transistor series connected with a second transistor between first and second power supply voltages; and a node disposed between the first and second transistors and configured to provide the output data and receive the input data. The first transistor may be a pull-up transistor of first conductivity type and the second transistor may be a pull-down transistor of second conductivity type. Indeed, the first transistor may be a PMOS transistor and the second transistor may be a NMOS transistor.

In yet another related aspect, during transmission of the output data the gates of the first and second transistors may commonly receive an output data voltage corresponding to the output data. During receipt of the input data, the gates of the first and second transistors may commonly receive a fixed power supply voltage. The fixed power supply voltage may be ground.

In yet another related aspect, the integrated circuit device may further comprise an input buffer connected in parallel with the data port and configured to receive the input data.

In yet another related aspect, the active inductive bias circuit may be a Complementary Metal Oxide Semiconductor (CMOS) inductive bias circuit.

In another embodiment of the inventive concept, a method of reading and writing data via a data port connected to a channel is disclosed. The method comprises; during a read operation, applying an output data voltage to an impedance matching circuit to generate output data at the data port, and adjusting impedance of the data port to the channel as a function of output data frequency using an active inductive bias circuit connected to the data port in parallel with the impedance matching circuit, and during a write operation, applying a fixed control voltage to the impedance matching circuit to receive input data via the data port, and adjusting impedance of the data port to the channel as a function of input data frequency using the active inductive bias circuit.

In a related aspect, the active inductive bias circuit may further comprise a voltage level shifting circuit and the method may further comprise either shifting a first voltage level of the output data generated by the impedance matching circuit to a second voltage level compatible with the channel, or shifting a first voltage level of the input data provided by the channel to a second voltage level compatible with the impedance matching circuit.

In another embodiment of the inventive concept, a system is disclosed and comprises; a memory controller, and a plurality of memory devices connected to the memory controller via at least one channel. Each one of the plurality of memory devices comprises; a data port configured to provide output data to a channel and receive input data from the channel, a impedance matching circuit connected to the data port and configured to operate as an output driver circuit during read operations and as an on die termination circuit during write operations, and an active inductive bias circuit connected to the data port in parallel with the impedance matching circuit, and configured to adjust the impedance of the data port to the channel during read operations as a function of output data frequency and adjust the impedance of the data port to the channel during write operations as a function of input data frequency.

In related aspects, the at least one channel may comprise a plurality of channels, each respectively connecting one of the plurality of memory devices to the master device. The memory controller may be a data processing unit, a central processing unit, a graphics processing unit, a memory system controller, or a master memory device. The at least one channel may comprise a primary signal channel shared by the plurality of memory devices, such that the primary signal channel is connected at one end to the memory controller and at an opposing end to a termination resistance, and the plurality of memory device are connected in parallel to the primary signal channel via respective data ports.

In another related aspect, the system may further comprise a substrate mounting the plurality of memory devices in a memory module, wherein the at least one channel comprises a memory module bus disposed on the substrate to connect the plurality of memory devices to the master device.

DETAILED DESCRIPTION OF EMBODIMENTS

Reference will now be made to certain embodiments illustrated in the accompanying drawings. Throughout the drawings and written description, like reference numbers and labels are used to indicate like or similar elements and features.

It should be noted that the present inventive concept may be embodied in many different forms. Accordingly, the inventive concept should not be construed as limited to only the illustrated embodiments. Rather, these embodiments are presented as teaching examples.

Those skilled in the art will recognize that enumerating terms (e.g., first, second, etc.) are used merely to distinguish between various elements. These terms do not define some numerical limitation on such elements.

As used herein, the term "and/or" includes any and all combinations of one or more of the associated listed elements. It is further understood that when an element is said to be "connected" or "coupled" to another element, it may be directly connected or coupled to the other element, or intervening elements may be present. In contrast, when an element is referred to as being "directly connected" or "directly coupled" to another element, no material intervening elements will be present. Other words used to describe element relationships should be interpreted in a like fashion (e.g., "between" versus "directly between," "adjacent" versus "directly adjacent," etc.).

Unless otherwise defined, all terms (including technical and scientific terms) used herein have the same meaning as commonly understood by one of ordinary skill in the art. It is further understood that terms, such as those defined in commonly used dictionaries, should be interpreted as having a meaning that is consistent with their meaning in the context of the relevant art and will not be interpreted in an idealized or overly formal sense unless expressly so defined herein.

Recognizing the physical size limitations associated with passive inductive components, embodiments of the inventive concept contemplate certain bidirectional equalizers incorporating active inductive components, such as those formed by conventionally understood Complementary Metal Oxide Semiconductor (CMOS) fabrication techniques and processes. In one more specific embodiment of the inventive concept, a bidirectional equalizer including a CMOS inductive bias circuit is incorporated within the I/O interface of semiconductor memory devices, including at least volatile memory such as Dynamic Random Access Memory (DRAM) and Synchronous Random Access Memory (SRAM), and nonvolatile memory such as Read Only Memory (ROM), Electrically Erasable Programmable Only Memory (EEPROM), NOR flash memory, NAND flash memory, Phase-Change Random Access Memory (PRAM), etc.

Figure 3:
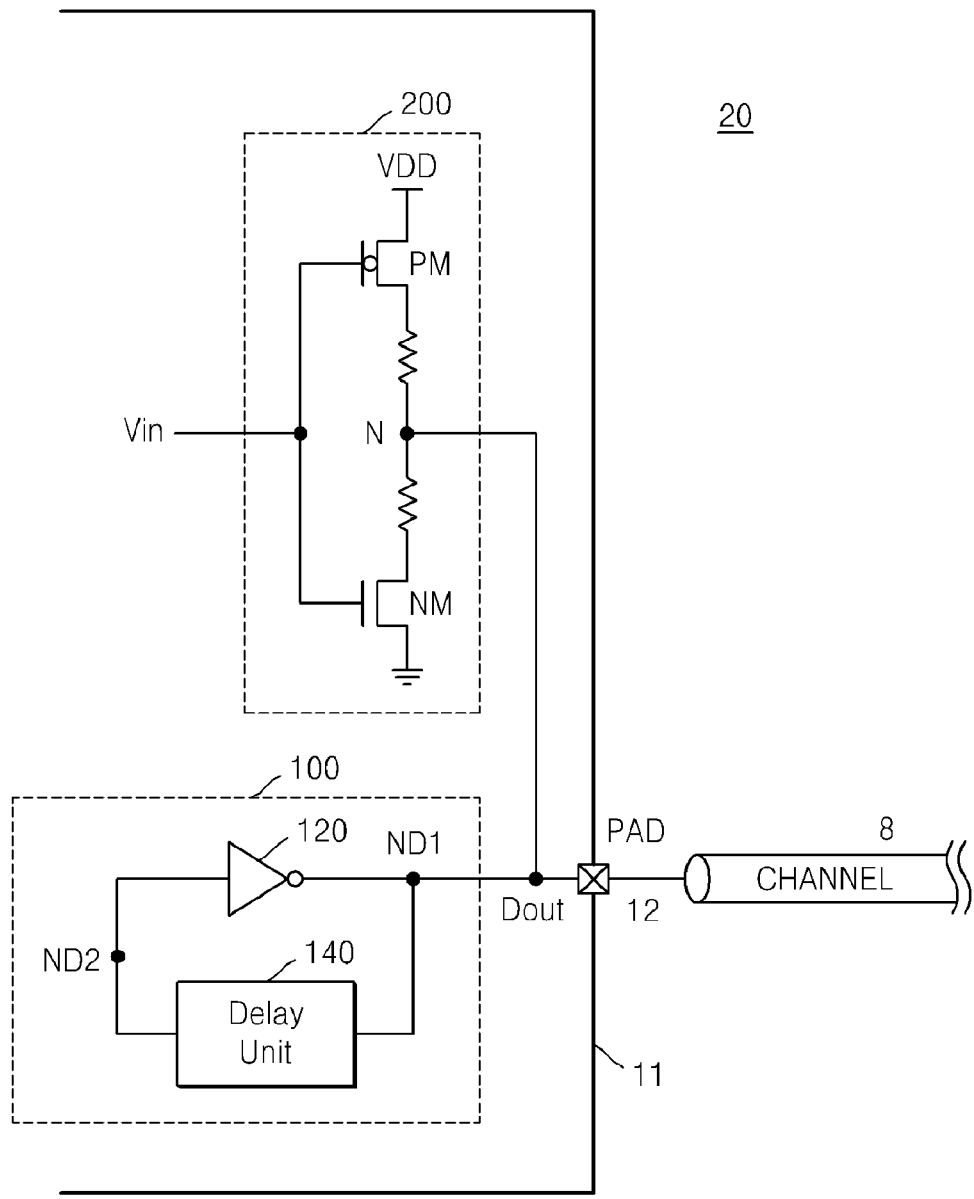
FIG. 3 is a circuit diagram illustrating a bidirectional equalizer incorporating a CMOS inductive bias circuit according to an embodiment of the inventive concept.

FIG. 3 illustrates an I/O interface 20 according to an embodiment of the inventive concept. The I/O interface 20 is conceptually illustrated as being disposed on a principle substrate of an integrated circuit or "chip" 11 formed from conventional materials. As is common with contemporary integrated circuits, the I/O interface 20 is associated with an electrical connection between a channel 8 and a signal termination point generically referred to hereafter as a "pad" 12.

Those skilled in the art will recognize that a great multiplicity of termination point structures are known in the art. These structures vary according to the nature of the integrated circuit device and the received/transmitted signal(s). Thus, the pad 12 may be associated with a variety of connection elements not shown in detail by the illustrated embodiment. Those skilled in art will also recognize that a plurality of pads are generally included within an integrated circuit device, but only a single pad 12 is illustrated in FIG. 3 for the sake of clarity.

The I/O interface 20 of FIG. 3 connects an impedance matching circuit 200 and a CMOS inductive bias circuit 100 in parallel at the pad 12. The impedance matching circuit 200 serves as both an on-die termination when the I/O interface 20 of the integrated circuit is acting as a receiver (RX) and an on-chip driver when the I/O interface 20 is acting as a transmitter (TX). Thus, the impedance matching circuit 200 may be understood as a transceiver (RX/TX) impedance matching circuit. During a "read operation" (i.e., any operation wherein the I/O interface 20 of the integrated circuit communicates "output data" to the channel 8), the impedance matching circuit 200 acts as a on chip driver, and during a "write operation" (i.e., any operation wherein the I/O interface 20 of the integrated circuit receives "input data" from the channel 8), the impedance matching circuit 200 acts as a on die termination. It should be noted at this point that read and write operations may both involve the receipt by the integrated circuit of address and/or control signals associated with the read and write operations. And while the description of the illustrated embodiments focuses on an I/O interface 20 specifically receiving/transmitting data via the pad 12, the dictates of the inventive concept may similarly be applied to data port (both termination and origination points) for address, clock, and/or control signals, as well as data signals.

There are many different specific circuits that may be used to implement the foregoing functionality (e.g., including at least the on die termination/on chip driver functions performed during read and write operations) of the impedance matching circuit 200. However, in the embodiment of the inventive concept illustrated in FIG. 3, the impedance matching circuit 200 comprises a PMOS transistor (PM) and a NMOS transistor (NM) series connected between a power supply voltage (e.g., $V_{DD}$) and ground. An input control voltage ($V_{IN}$) is commonly applied to the gates of the PM and NM transistors, and an I/O voltage is apparent at node (N) in response to the input control voltage $V_{IN}$.

Thus, the nature of the input control voltage $V_{IN}$ will vary in accordance with the functionality of the I/O interface 20. For example, during a read operation the impedance matching circuit 200 functions within the constituent integrated circuit to facilitate the transmission of output data. Accordingly, the input control voltage $V_{IN}$ (acting as a gate voltage applied to the PM and NM transistors) may correspond to an inverted output data signal ($D_{OUTB}$) derived from the output data signal ($D_{OUT}$) generated by the chip 11. That is, where the chip 11 is a semiconductor memory device, the output data signal $D_{OUT}$ may correspond to conventionally understood "read data" signals generated by execution of a conventional read operation (e.g., output signals provided by sense amplifier circuitry). With the inverted output data signal ($D_{OUTB}$) applied as the input control voltage $V_{IN}$, for example, the PM transistor functions as a pull-up transistor when the output data signal ($D_{OUT}$) is logically high and therefore the inverted output data signal ($D_{OUTB}$) is logically low. In similar vein with the inverted output data signal ($D_{OUTB}$) applied as the input control voltage $V_{IN}$, the NM transistor functions as a pull-down transistor when the output data signal ($D_{OUT}$) is low and the inverted output data signal ($D_{OUTB}$) is high.

During a write operation the impedance matching circuit 200 functions within the constituent integrated circuit to facilitate the receipt of input data. Accordingly, the input control voltage $V_{IN}$ (acting as a gate voltage applied to the PM and NM transistors) may correspond to a fixed control voltage (e.g., $V_{SS}$ or ground) internally generated or externally applied to the chip 11 as shown, for example in FIG. 8, inclusive of FIGS. 8A, 8B and 8C. That is, where the chip 11 is a semiconductor memory device, a fixed control voltage applied as the input control voltage $V_{IN}$ to the impedance matching circuit 200 be a conventionally generated control voltage, such as $V_{SS}$, provided within the general operation of chip 11. In the illustrated embodiment of FIG. 3, with a fixed control voltage applied as the input control voltage $V_{IN}$, the PM transistor is turned ON and the NM transistor is turned OFF to realize an on dire termination circuit.

Figure 1:
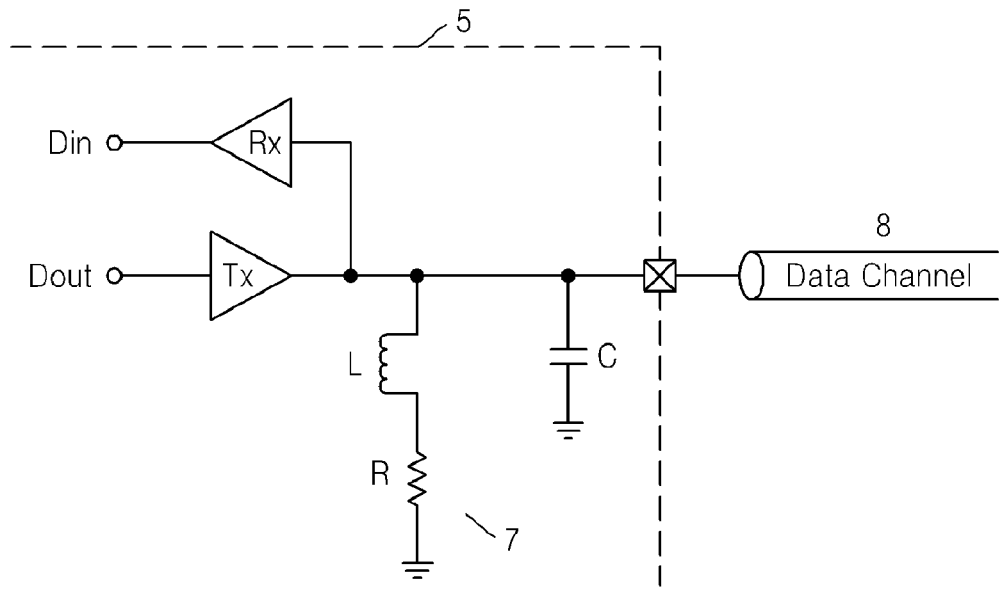
FIG. 1 is a circuit diagram of a conventional I/O interface connected to a channel.
Figure 2:
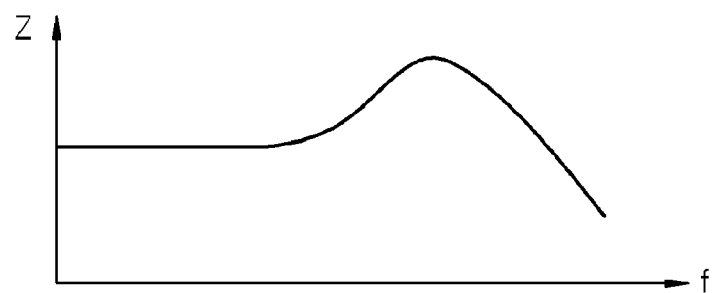
FIG. 2 is a graph illustrating a frequency/impedance relationship for an inductor, such as the type commonly used in equalizers.

Recognizing the aforementioned difficulties associated with relatively high data I/O frequencies, the CMOS inductive bias circuit 100 is connected in parallel with the impedance matching circuit 200 at pad 12. In operation, the CMOS inductive bias circuit 100 causes the overall impedance of pad 12, as seen by (or as electrically apparent to) the channel 8, to change as a function of the frequency of the I/O signal being transmitted or received. In effect, the inductive component of the I/O interface 20 varies with the I/O signal frequency (see, FIG. 2) to effectively equalize the I/O impedance (Z) of the pad 12 in relation to the channel 8. For example, as I/O signal frequencies begin to exceed 6 MHz, conventional I/O interfaces begin to fail and impedance mismatches arise. These impedance mismatches can lead to data incoherency in the form of ISI, noise signal reflections, signal phase and timing errors, etc. In contrast, certain embodiments of the inventive concept incorporating a CMOS inductive bias circuit in parallel with an impedance matching circuit are able to provide effective impedance matching for I/O signals greatly in excess of 6 MHz.

Some embodiments of the inventive concept contemplate the further incorporation of a protection circuit associated with the pad 12 and protecting circuitry proximate to the pad 12 from the potentially harmful effects of electro-static discharge (ESD) and/or electromagnetic interference (EMI). Such protection circuits are many and varied in design and are understood by those skilled in the art.

Figure 4:
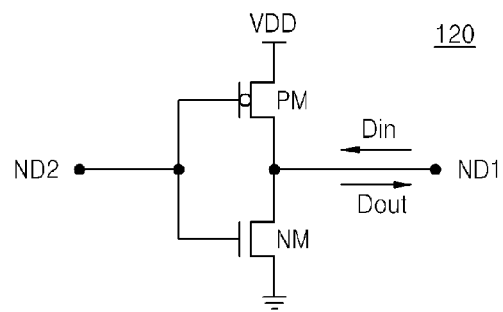
FIG. 4 is a circuit diagram further illustrating one possible embodiment for the inverter in CMOS inductive bias circuit of the equalizer shown in FIG. 3.

As illustrated in FIG. 3, the CMOS inductive bias circuit 100 comprises a loop connected isolating inverter 120 and delay unit 140. FIG. 4 is a circuit diagram illustrating one possible embodiment for the isolating inverter 120 comprising a PMOS transistor (PM) and a NMOS transistor (NM) connected in series between a power supply voltage (e.g., $V_{DD}$) and ground. A signal apparent at a second loop node ND2 (i.e., a delayed version of an I/O signal apparent at pad 12, such as output data signal $D_{OUT}$ or input data signal $D_{IN}$) is commonly applied to the gates of the PM and NM transistors to generate a delayed and inverted version of the I/O signal. Before being applied to the inverter 120, however, the I/O signal apparent at the pad 12 is first delayed by delay unit 140 to yield the temporal signal relationships illustrated in the waveform diagrams of FIG. 5, inclusive of FIGS. 5A and 5B.

Figure 5:
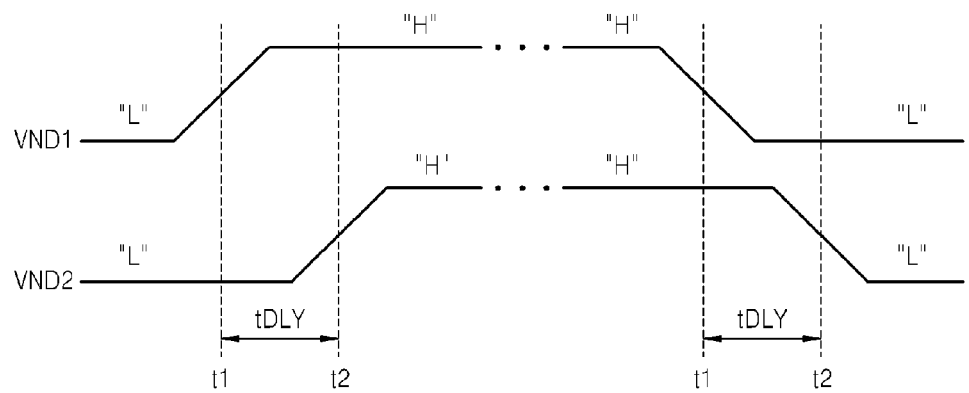
FIG. 5, inclusive of FIGS. 5A and 5B, is a waveform diagram further illustrating the operative nature of the CMOS inductive bias circuit of the equalizer shown in FIG. 3.

In FIG. 5, an assumed logically "low" I/O signal is initially received at the first loop node ND1 from pad 12. The low I/O signal is delayed by a defined delay period "$t_{DLY}$" extending between a first time t1 to a second time t2 by means of the delay unit 140. Thus, a logic transition occurring at the first time t1 at the first loop node ND1 will result in a corresponding logic transition occurring at the second time t2 at the second loop node ND2. As illustrated in FIG. 5A, the signal level apparent at the second loop node ND2 turns ON the PM transistor until the second time t2, following the delay from the first time t1, and as illustrated in FIG. 5B, the NM transistor is turned ON until the second time t2.

Thus, referring to FIG. 5A, as the PM transistor is turned ON until the second time t2, the output voltage apparent at the first loop node ND1 (i.e., VND1 now connected to $V_{DD}$) may be fully pulled up. Similarly, referring to FIG. 5B as the NM transistor is turned ON until the second time t2, the output voltage apparent at the first loop node ND1 (i.e., VND1 now connected to ground) may be fully pulled down. In this manner, low/high and high/low transitions in the voltage apparent at the first loop node ND1 of the CMOS inductive bias circuit 100 (which is electrically equivalent to the voltage apparent at the pad 12) will be characterized by a full voltage swing between $V_{DD}$ and ground. And this is especially true for I/O signals having relatively high frequencies. In effect, the CMOS inductive bias circuit 100 efficiently functions as a frequency variable inductive component in high performance impedance matching circuitry associated with pad 12. However, the CMOS inductive bias circuit 100 does not require the inclusion of a passive inductor, thereby facilitating efforts to densely integrate the incorporating integrated circuit.

Figure 6:
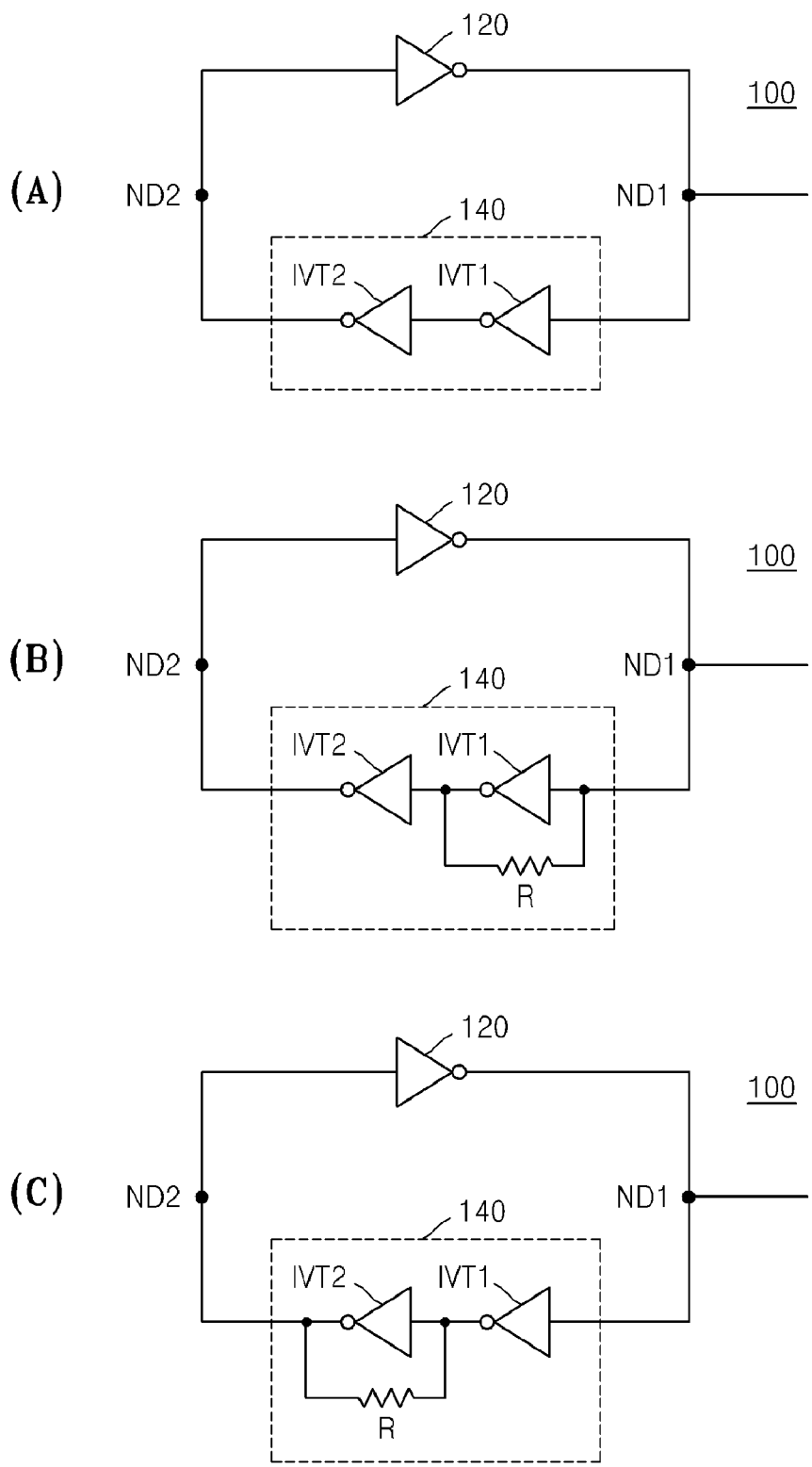
FIG. 6, inclusive of FIGS. 6A, 6B and 6C, further illustrates several possible embodiments for the delay unit of the CMOS inductive bias circuit of the equalizer shown in FIG. 3.

FIG. 6, inclusive of FIGS. 6A, 6B, and 6C illustrates several possible embodiments for the CMOS inductive bias circuit 100 of FIG. 3. These examples variously include a plurality of inverters (at least IVT1 and IVT2) series connected between the first loop node ND1 and the second loop node ND2. The number and type of series connected inverters will vary with the desired delay period "$t_{DLY}$". Other delay elements well know in the art may be substituted for one or more of the delaying inverters in view of specific design goals.

Figure 7A:
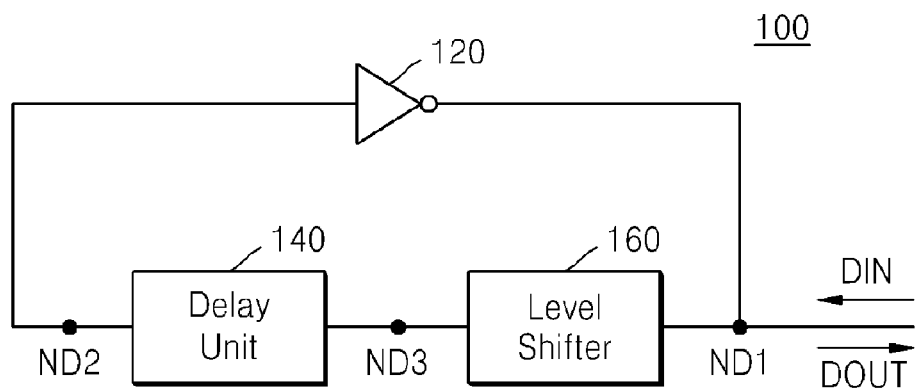
FIG. 7A is circuit diagram illustrating another possible embodiment for the CMOS inductive bias circuit of the equalizer shown in FIG. 3.
Figure 7B:
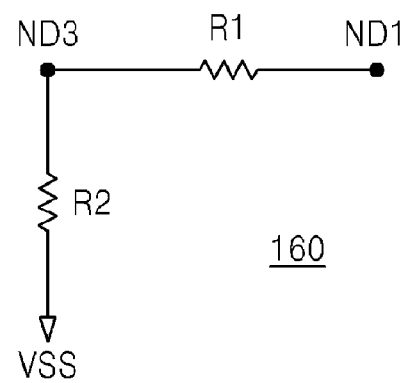
FIG. 7B is an equivalent circuit diagram further illustrating this possible embodiment.

FIG. 7, inclusive of FIGS. 7A and 7B, illustrates an alternate embodiment for the CMOS inductive bias circuit 100 of FIG. 3. In FIG. 7A, the CMOS inductive bias circuit 100 comprises in addition to the isolating inverter 120 and the delay unit 140, a voltage level shifter 160. The additional incorporation of the level shifter 160 is be particularly useful where the channel 8 and the circuitry of the I/O interface 20 (or other circuitry internal to the chip 11) are adapted to operate at different voltage levels.

As illustrated in one possible embodiment shown in FIG. 7B, the level shifter 160 may be readily implemented by a voltage divider (R1/R2) connected in parallel between a third loop node ND3 and ground/first loop node ND1. Those skilled in the art will recognize that one of a great number of conventionally understood voltage level shifting circuits might be used in conjunction with the CMOS inductive bias circuit 100 (i.e., within the CMOS inductive bias circuit 100 or between the CMOS inductive bias circuit 100 and the pad 12).

Figure 8A:
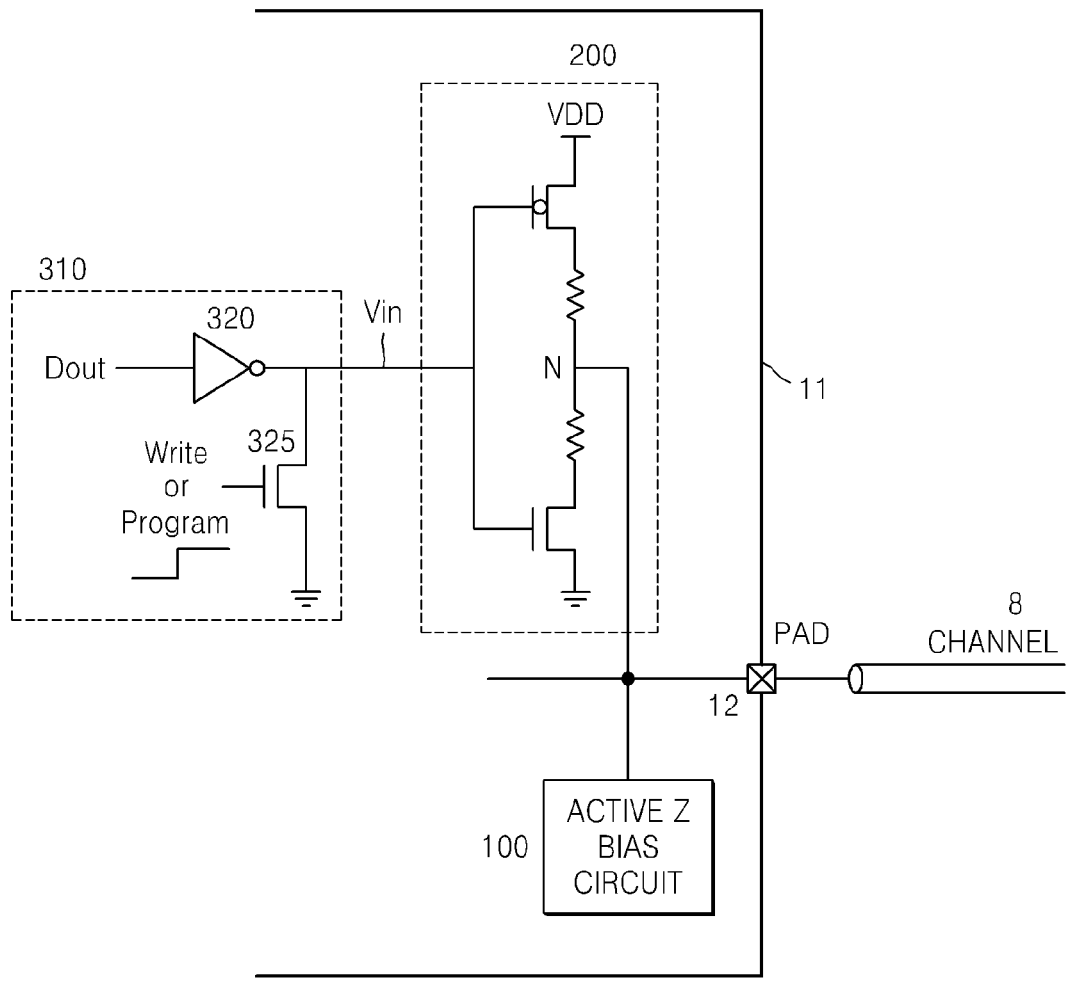
FIGS. 8A, 8B and 8C are circuit diagrams illustrating certain bidirectional equalizers variously incorporating a CMOS inductive bias circuit according to embodiments of the inventive concept.
Figure 8B:
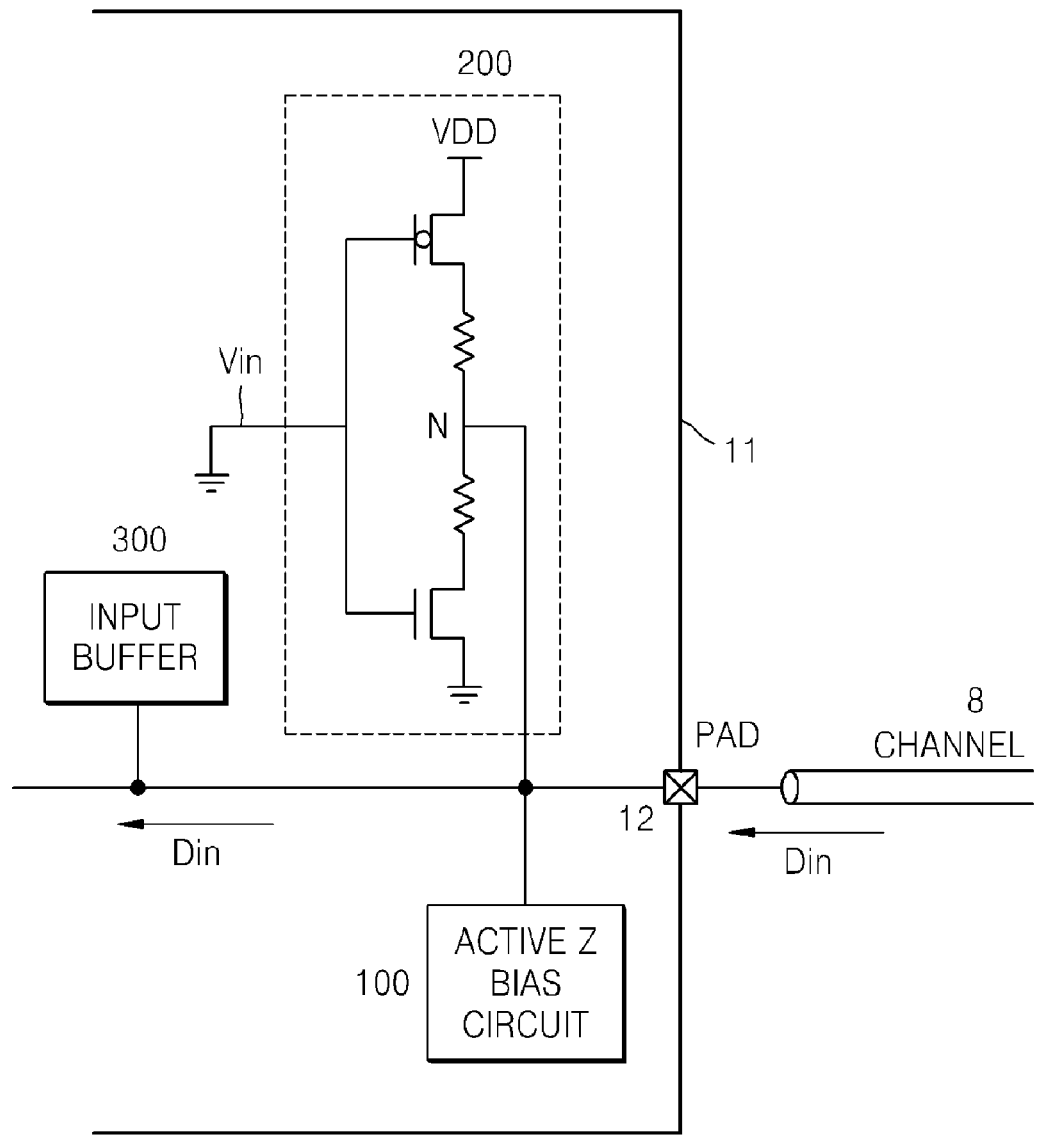
Figure 8C:
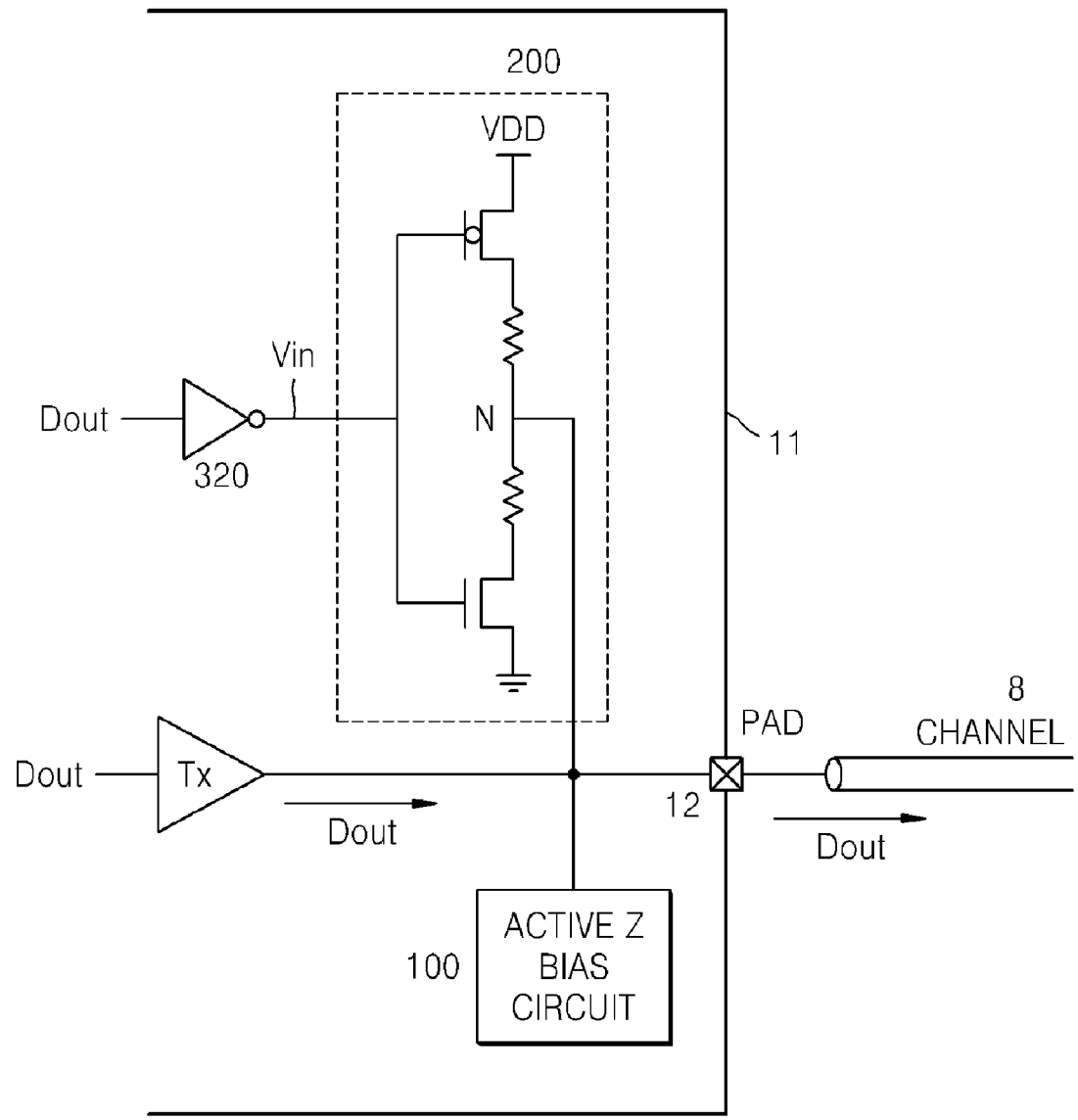

FIG. 8, inclusive of FIGS. 8A, 8B, and 8C are block level circuit diagrams illustrating certain embodiments of the inventive concept. In each illustrated embodiment, the CMOS inductive bias circuit 100 and impedance matching circuit 200 are connected in parallel to a pad 12 which is also connected a channel 8.

In FIG. 8A, the input control voltage $V_{IN}$ is provide to the (transceiver) impedance matching circuit 200 by an input control voltage $V_{IN}$ controller 310. In the embodiment of FIG. 8A, the input control voltage $V_{IN}$ controller 310 comprises an inverter 320 deriving the inverted output data signal ($D_{OUTB}$) from the output data signal ($D_{OUT}$). Application of the inverted output data signal ($D_{OUTB}$) is controlled by transistor 325 gated by a conventionally understood write/program control signal.

Figure 13:
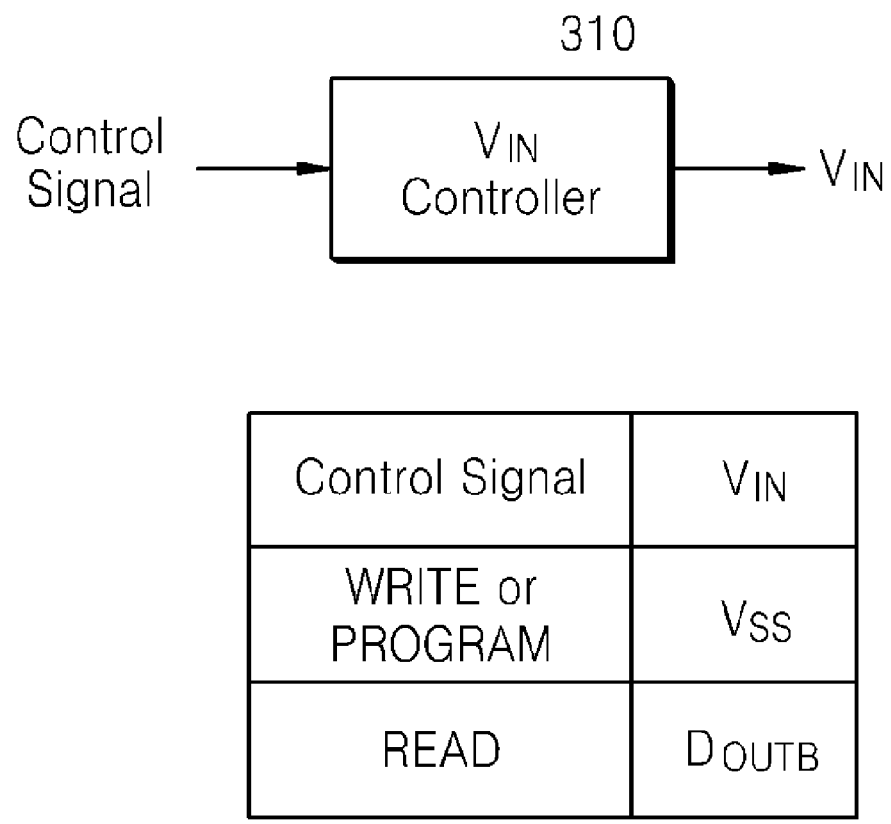
FIG. 13 is a block diagram further illustrating the input voltage controller of FIG. 8.

The input control voltage $V_{IN}$ controller 310 is further illustrated in the block diagram of FIG. 13, wherein the state of a defined control signal (e.g., a read/write (program) enable signal) controls the nature of the input control voltage $V_{IN}$. For example, the input control voltage $V_{IN}$ may be set to a fixed control voltage (e.g., $V_{SS}$) when a write/program enable signal is applied or the inverted output data signal ($D_{OUTB}$) when a read enable signal is applied.

In the embodiment of FIG. 8B, the (transceiver) impedance matching circuit 200 is shown configured in receiver (RX) mode with the fixed control voltage ($V_{SS}$) applied to the gates of the series connected PM and NM transistor—effectively yielding a circuit comprising only the active PM transistor connected between the power supply voltage $V_{DD}$ and the output node N. In this configuration, the I/O interface 30 may function as an on die termination during a write/program operation. The input data ($D_{IN}$) received at pad 12 from channel 8 is effectively impedance matched by the combination of the CMOS inductive bias circuit 100 and the impedance matching circuit 200 and passes to an input buffer circuit 300 internal to chip 11. The use of an input buffer circuit 300 in this context is conventionally understood, and the input buffer circuit 300 may be used to re-time, temporally buffer, or aggregate the received input data $D_{IN}$ before further data processing internal to chip 11. Thus, the embodiment of FIG. 8B shows a configuration relative to the circuit of FIG. 8A, wherein an input control voltage $V_{IN}$ node "N" within the impedance matching circuit 200 is effectively grounded by application of a write/program enable signal (i.e., the transistor 325 is high connecting the input control voltage $V_{IN}$ node "N" to ground ($V_{SS}$).

In other variations of the embodiment illustrated in FIG. 8B, the input buffer circuit 300 may amplify a received input data $D_{IN}$ signal and/or convert a received analog input data $D_{IN}$ signal to digital form prior to further data processing with the integrated circuit. Those skilled in the art will recognize that one of many different kinds of input buffer circuits 300 may be used for these and other purposes.

In contrast the embodiment of FIG. 8C shows the impedance matching circuit 200 configured in a transmitter (TX) mode with an active control voltage (e.g., the inverted output data signal $D_{OUTB}$) applied to the gates of the series connected PM and NM transistor. In this configuration, the I/O interface 30 may function as an off chip driver (OCD) during a read operation. The output data ($D_{OUT}$) received at pad 12 from transmitter circuit 330 is effectively impedance matched to the channel 8 by the combination of the CMOS inductive bias circuit 100 and the impedance matching circuit 200. Thus, the embodiment of FIG. 8C shows a configuration relative to the circuit of FIG. 8A, wherein an input control voltage $V_{IN}$ node "N" within the impedance matching circuit 200 receives an active control voltage (e.g., the inverted output data signal $D_{OUTB}$) by application of a read enable signal (i.e., the transistor 325 is low connecting the output of the inverter 320 to the input control voltage $V_{IN}$ node "N".

At this point it should also be noted that the input control signal $V_{IN}$ controller 310 of FIG. 13 may be provided as part of (or in conjunction with) the control circuitry of the integrated circuit device incorporating an embodiment of the inventive concept. As noted above, the input control signal $V_{IN}$ controller 310 may be used to properly define the input control voltage $V_{IN}$ applied to the transceiver impedance matching circuit 200 (e.g., either the inverted output data signal $D_{OUTB}$ or $V_{SS}$) in response to a higher level device command, such as a read command or write/program command. For example, assuming the integrated circuit (i.e., chip 11) is a semiconductor memory device receiving a write/program command from an associated memory controller, central processing unit (CPU), control unit, master memory device, etc., the input control signal $V_{IN}$ controller 310 may generate and apply corresponding control signals to cause the impedance matching circuit 200 to function as an on die termination circuit, including the generation and application of the fixed control voltage ($V_{SS}$) to the gates of the PM and NM transistors of FIG. 3. Alternately, assuming the integrated circuit (i.e., chip 11) is a semiconductor memory device receiving a read command from the associated memory controller, CPU, control unit, master memory device, etc., the input control signal $V_{IN}$ controller 310 may generate and apply corresponding control signals to cause the impedance matching circuit 300 to function as an impedance matched output driver circuit including generation and application of an active control voltage (inverted output data signal $D_{OUTB}$) to the gates of the PM and NM transistors of FIG. 3.

Figure 9:
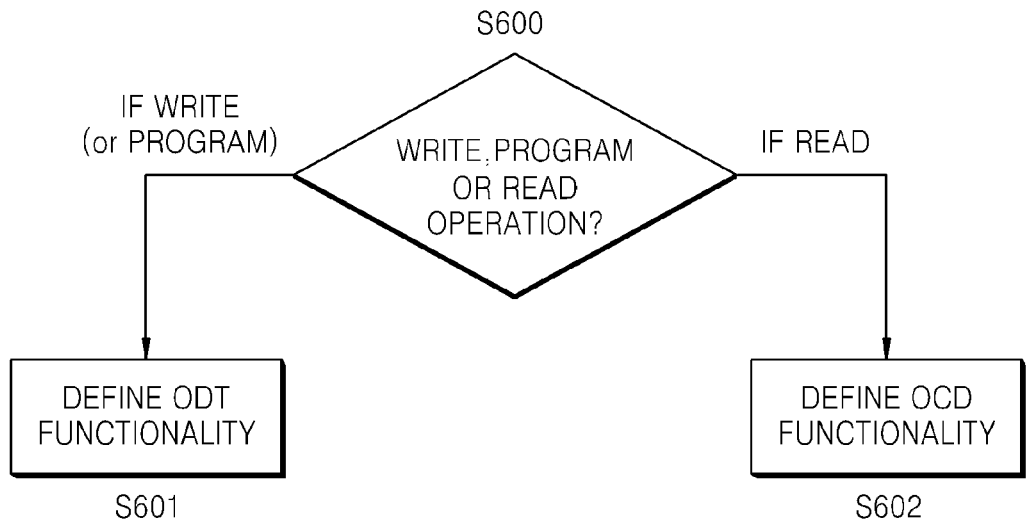
FIG. 9 is a flowchart summarizing a control method for communicating data according to an embodiment of the inventive concept.

Thus, by operation of an input control signal $V_{IN}$ controller, certain embodiments of the inventive concept may implement a method adapted to control the communication of I/O signals as summarized by the flowchart of FIG. 9. In this control method, a command (e.g., a received command packet or an equivalent collection of control signals) indicating a defined data access operation is examined to determine whether a read operation, a write/program operation is indicated (S600). Where a read operation is indicated, the input control signal $V_{IN}$ controller causes an I/O interface according to an embodiment of the inventive concept to function as a frequency/impedance matched on chip driver by (e.g.) generating and applying the inverted signal $D_{OUTB}$ to the gates of the PM and NM transistors of FIG. 3 (S602). Alternately, where a write/program operation is indicated, the input control signal $V_{IN}$ controller causes the I/O interface according to an embodiment of the inventive concept to function as a frequency/impedance matched on die termination by (e.g.) generating and applying the fixed control voltage ($V_{SS}$) to the gates of the PM and NM transistors of FIG. 3 (S601).

As previously noted, a plurality of I/O interfaces implemented according to an embodiment of the inventive concept and associated with multiple I/O signal pads may be incorporated into a variety of integrated circuits, including memory devices and/or related control devices. The I/O signal pads may communicate (i.e., transmit and/or receive) data, address, clock and/or control signals. Integrated circuit devices incorporating I/O interfaces implemented according to an embodiment of the inventive concept may be variously combined within data processing systems.

Figure 10:
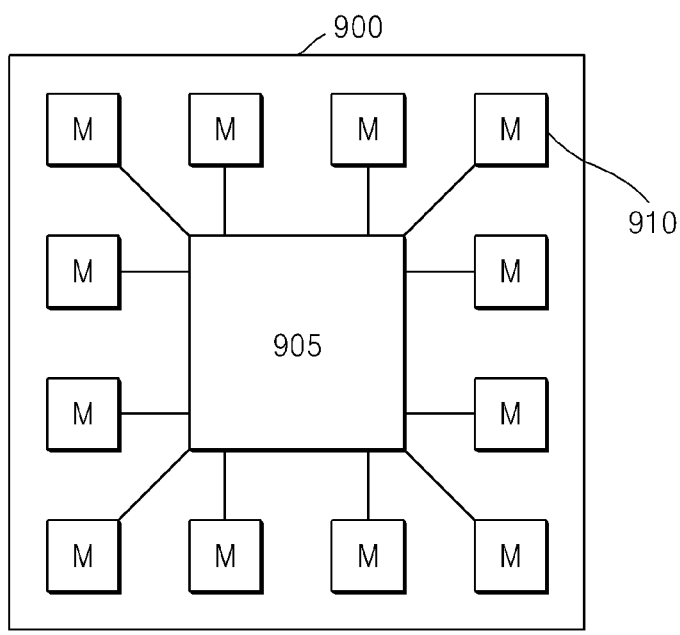
FIGS. 10, 11 and 12 illustrate several application embodiments for a bidirectional equalizer incorporating a CMOS inductive bias circuit according to an embodiment of the inventive concept.

For example, as illustrated in the memory system 900 of FIG. 10, a "memory controller" 905 (e.g., a memory system controller, a CPU, a data switch or bridge, a master memory device, a processor, an Application Specific Integrated Circuit (ASIC), etc.) may be connected with a plurality of memory devices 910 via a plurality of buses. Those skilled in the art will recognize that many bus connection variations and bus architectures are possible between the memory controller unit 905 and the plurality of memory devices 910. Each bus will include at least one signal line forming an I/O signal channel terminated at a memory device (M) and/or the control unit 905 at a corresponding data port. The data port may be impedance matched relative to the frequency of the I/O signal communicated via the I/O signal channel using an embodiment of the inventive concept.

Figure 11:
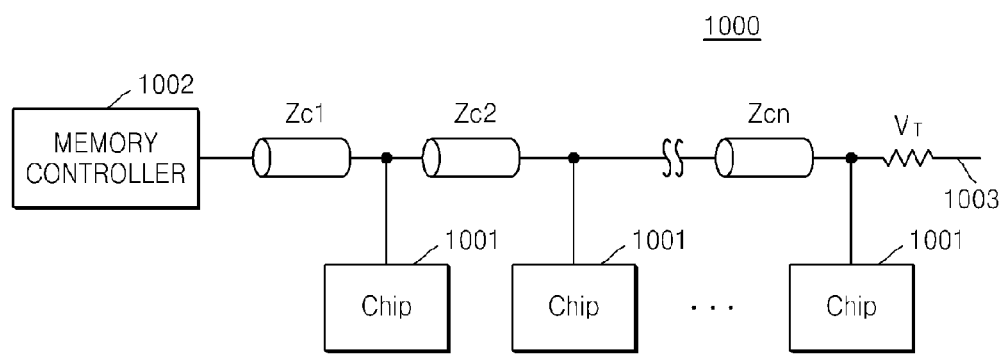

In another example, as illustrated in the memory system 1000 of FIG. 11, a memory controller 1002 may be "drop connected" with a plurality of memory devices 1001 via a primary signal channel 1003. Each segment of the primary signal channel 1003 between drop points may be characterized by an impedance ($Z_{C1}$, $Z_{C2}$, ... $Z_{CN}$) relative to the frequency of the one or more data, address and/or control signals being communicated. The respective memory devices may include corresponding data ports that are frequency impedance matched to the primary signal channel (or primary signal channel segment) by an embodiment of the inventive concept.

Figure 12:
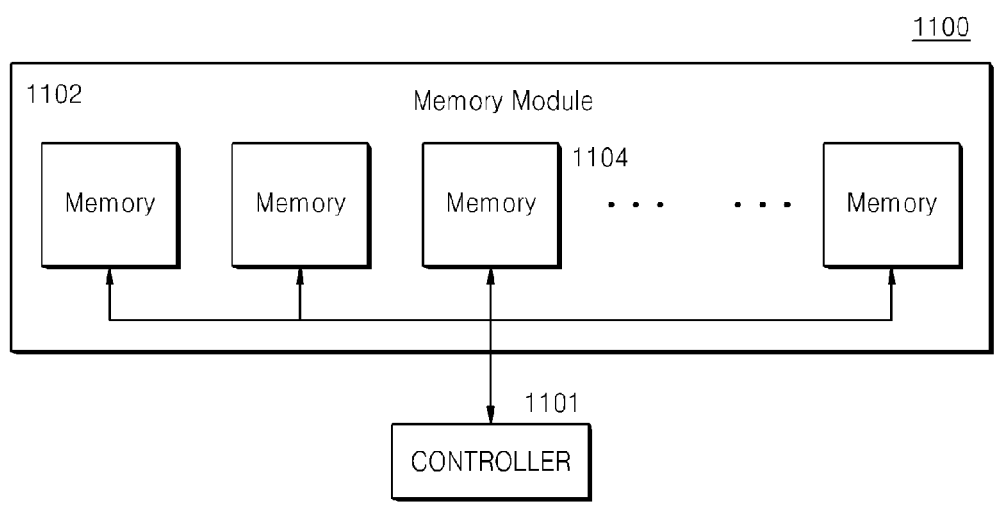

In yet another example, as illustrated in the memory system 1100 of FIG. 12, a memory controller 1101 may interface with a memory module 1102 functionally assembling a plurality of memory devices 1104. As before each memory device, as well as the memory controller may incorporate one or more data ports being frequency impedance matched to a corresponding signal channel (e.g., a bus signal line) via an embodiment of the inventive concept.

While exemplary embodiments of the inventive concept have been particularly shown and described above, it is understood that various changes in form and detail may be made therein without departing from the scope of the following claims. For example, a CMOS inductive bias circuit has been described above in the context of several embodiments. While CMOS fabrication technology is widely used, well understood, and capable of efficiently providing very small circuits, the active inductive bias circuit required by the inventive concept need not be a CMOS circuit. Other fabrication technologies and resulting circuit components may be used to implement embodiment of the inventive concept. Similarly, a "pad" has been described above as a channel connection element. Those skilled in the art will recognize that many types of structures, including pads, pins, lands, ball grid elements, terminal structures, lead structures, etc., may be used to implement a "data port" capable of being impedance matched to a corresponding channel by an embodiment of the inventive concept.

What is claimed is:
1. An integrated circuit device, comprising:
a data port configured to provide output data to a channel and receive input data from the channel;
an impedance matching circuit connected to the data port and configured to operate as an output driver circuit when the output data is being transmitted and as an on die termination circuit when the input data is being received; and
an active inductive bias circuit connected to the data port in parallel with the impedance matching circuit, and configured to adjust the impedance of the data port to the channel during transmission of the output data as a function of output data frequency and adjust the impedance of the data port to the channel during receipt of the input data as a function of input data frequency.
2. The integrated circuit device of claim 1, wherein the active inductive bias circuit comprises a delay circuit comprising a first loop node connected to the data port and a second loop node separated from the first node by a delay unit.
3. The integrated circuit device of claim 2, wherein the delay circuit further comprises an isolating inverter disposed in parallel with the delay unit between the first and second loop nodes.
4. The integrated circuit device of claim 2, wherein the delay unit comprises a plurality of series connected inverters.

5. The integrated circuit device of claim 2, wherein the active inductive bias circuit further comprises a voltage level shifting circuit disposed between the first loop node and the delay unit.

6. The integrated circuit device of claim 4, wherein the voltage level shifting circuit comprises a plurality of voltage dividing resistors.

7. The integrated circuit device of claim 1, wherein the impedance matching circuit comprises:
  a first transistor series connected with a second transistor between first and second power supply voltages; and
  a node disposed between the first and second transistors and configured to provide the output data and receive the input data.

8. The integrated circuit device of claim 7, wherein the first transistor is a pull-up transistor of first conductivity type and the second transistor is a pull-down transistor of second conductivity type.

9. The integrated circuit device of claim 7, wherein the first transistor is a PMOS transistor and the second transistor is a NMOS transistor.

10. The integrated circuit device of claim 7, wherein during transmission of the output data the gates of the first and second transistors commonly receive an inverted version of an output data voltage corresponding to the output data.

11. The integrated circuit device of claim 7, wherein during receipt of the input data the gates of the first and second transistors commonly receive a fixed power supply voltage.

12. The integrated circuit device of claim 11, wherein the fixed power supply voltage is ground.

13. The integrated circuit device of claim 1, further comprising:
  an input buffer connected in parallel with the data port and configured to receive the input data.

14. The integrated circuit device of claim 1, wherein the active inductive bias circuit is a Complementary Metal Oxide Semiconductor (CMOS) inductive bias circuit.

15. A method of reading and writing data via a data port connected to a channel, the method comprising:
  during a read operation, applying an inverted version of an output data voltage to an impedance matching circuit to generate output data at the data port, and adjusting impedance of the data port to the channel as a function of output data frequency using an active inductive bias circuit connected to the data port in parallel with the impedance matching circuit; and
  during a write operation, applying a fixed control voltage to the impedance matching circuit to receive input data via the data port, and adjusting impedance of the data port to the channel as a function of input data frequency using the active inductive bias circuit.

16. The method of claim 15, wherein the active inductive bias circuit comprises:
  a delay circuit comprising a first loop node connected to the data port and a second loop node separated from the first node by a delay unit.

17. The method of claim 16, wherein the delay circuit further comprises an isolating inverter disposed in parallel with the delay unit between the first and second nodes.

18. The method of claim 16, wherein the active inductive bias circuit further comprises a voltage level shifting circuit disposed between the first loop node and the delay unit.

19. The method of claim 18, further comprising:
  shifting a first voltage level of the output data generated by the impedance matching circuit to a second voltage level compatible with the channel.

20. The method of claim 18, further comprising:
  shifting a first voltage level of the input data provided by the channel to a second voltage level compatible with the impedance matching circuit.

21. A system comprising:
  a memory controller;
  a plurality of memory devices connected to the memory controller via at least one channel,
  wherein each one of the plurality of memory devices comprises;
    a data port configured to provide output data to a channel and receive input data from the channel;
    an impedance matching circuit connected to the data port and configured to operate as an output driver circuit during read operations and as an on die termination circuit during write operations; and
    an active inductive bias circuit connected to the data port in parallel with the impedance matching circuit, and configured to adjust the impedance of the data port to the channel during read operations as a function of output data frequency and adjust the impedance of the data port to the channel during write operations as a function of input data frequency.

22. The system of claim 21, wherein the at least one channel comprises a plurality of channels, each respectively connecting one of the plurality of memory devices to the master device.

23. The system of claim 22, wherein the memory controller is a data processing unit, a central processing unit, a graphics processing unit, a memory system controller, or a master memory device.

24. The system of claim 21, wherein the at least one channel comprises a primary signal channel shared by the plurality of memory devices.

25. The system of claim 24, wherein the primary signal channel is connected at one end to the memory controller and at an opposing end to a termination resistance, and the plurality of memory device are connected in parallel to the primary signal channel via respective data ports.

26. The system of claim 21, further comprising a substrate mounting the plurality of memory devices in a memory module, wherein the at least one channel comprises a memory module bus disposed on the substrate to connect the plurality of memory devices to the master device.

27. The system of claim 21, wherein the active inductive bias circuit of each one of the plurality of memory devices comprises a voltage level shifting circuit shifting a first voltage level of the output data to a second voltage level compatible with the at least one channel.

28. The system of claim 21, wherein the active inductive bias circuit of each one of the plurality of memory devices comprises a voltage level shifting circuit shifting a first voltage level of the input data to a second voltage level compatible with the at least one channel.

29. The system of claim 21, wherein the active inductive bias circuit of each one of the plurality of memory devices is a Complementary Metal Oxide Semiconductor (CMOS) inductive bias circuit.

* * * * *